(12) United States Patent
Leibiger et al.

(10) Patent No.: US 7,824,999 B2
(45) Date of Patent: Nov. 2, 2010

(54) METHOD FOR ENHANCING FIELD OXIDE

(75) Inventors: Steven Leibiger, Falmouth, ME (US);
Daniel J. Hahn, Cumberland, ME (US)

(73) Assignee: Fairchild Semiconductor Corporation, South Portland, ME (US)

(*) Notice: Subject to any disclaimer, the term of this patent is extended or adjusted under 35 U.S.C. 154(b) by 38 days.

(21) Appl. No.: 12/017,742

(22) Filed: Jan. 22, 2008

(65) Prior Publication Data

US 2008/0113482 A1    May 15, 2008

Related U.S. Application Data

(62) Division of application No. 10/857,218, filed on May 28, 2004, now abandoned.

(51) Int. Cl.
*H01L 21/76* (2006.01)
(52) U.S. Cl. .................. 438/400; 257/E21.346; 257/E21.552; 257/E21.642
(58) Field of Classification Search .......... 430/400; 257/E21.346, E21.522, E21.642
See application file for complete search history.

(56) References Cited

U.S. PATENT DOCUMENTS

| | | | |
|---|---|---|---|
| 4,101,344 A | 7/1978 | Kooi et al. | |
| 4,506,437 A | 3/1985 | Godejahn, Jr. | |
| 4,593,453 A | 6/1986 | Tam | |
| 5,480,822 A | 1/1996 | Hsue et al. | |
| 5,698,902 A * | 12/1997 | Uehara et al. | 257/773 |
| 5,742,095 A | 4/1998 | Bryant et al. | |
| 6,528,413 B2 * | 3/2003 | Hashimi | 438/630 |
| 2003/0062587 A1 | 4/2003 | Sekikawa et al. | |

* cited by examiner

*Primary Examiner*—Charles D Garber
*Assistant Examiner*—Stanetta D Isaac
(74) *Attorney, Agent, or Firm*—Thomas R. FitzGerald, Esq.; Hiscock & Barclay, LLP (57) ABSTRACT

A CMOS device with polysilicon protection tiles is shown in FIG. 2. LOCOS regions 12.1 and 12.2 separate adjacent active regions 16.1 from 16 and 18.1 from 18, respectively. On the upper surface of the LOCOS regions 12.1, 12.2 are polysilicon tiles 14.1, 14.2, respectively. At the corner of the gate polysilicon 14.3 and the polysilicon tiles 14.1 and 14.2 are oxide spacers 60.1-60.6. The polysilicon tiles 14.1, 14.2 have silicide layers 50.1, 50.2. Other silicide layers 50.4-50.6 are on the tops of the source, drain and polysilicon gate. An insulation layer 32 covers the substrate and metal contacts 36, 34, 38 extend from the surface of the layer 32 to the silicide layers on the source, gate and drain, respectively. The polysilicon tiles are made from the same layer of polysilicon as the gate and they are formed simultaneously with the gates. The intention of the polysilicon tiles is to reduce erosion of the field oxide between closely spaced active regions. In addition, the poly tiles themselves increase the thickness of the isolation between active silicon regions when it must serve as a self-aligned blocking layer for an ion implantation step.

17 Claims, 12 Drawing Sheets

Fig. 1

PRIOR ART

METHOD FOR ENHANCING FIELD OXIDE

CROSS REFERENCE TO RELATED APPLICATIONS

This application is a divisional of U.S. patent application Ser. No. 10/857,218 filed May 28, 2004.

BACKGROUND

The localized oxidation of silicon (LOCOS) isolation method is widely used in many processes for manufacturing semiconductor integrated circuits. Using LOCOS, active silicon areas on the surface of a monocrystalline silicon substrate or silicon epitaxial layer can be electrically isolated by relatively thick insulating oxide regions. A patterned film of deposited silicon nitride (Si3N4) is used to selectively suppress oxide growth where active silicon is desired. Devices such as diodes, transistors, resistors, capacitors and other microelectronic structures are subsequently built in these active silicon regions between the insulating oxide regions. Such electrical isolation is essential to prevent unwanted electrical device to device interaction.

LOCOS processes start with deposition of an initial layer of silicon dioxide or other buffer layer to relieve stresses on the wafer surface. Nitride is then deposited on top of this oxide. The nitride is patterned using standard photolithography and etching techniques to define the LOCOS and active silicon areas. Oxide is thermally grown in the exposed areas, while the areas covered with nitride experience no oxide growth. Next, the masking nitride and oxide buffer layers are removed to expose the silicon active areas to further processing and ultimate device fabrication. The isolation oxide electrically isolates the adjacent devices.

Besides device isolation, the oxide is also used to mask ion implantation dopant introduction. The oxide blocks the implant from all areas but the exposed active silicon. Since the oxide also defines the active silicon regions, this masking is self aligned. This use is critical when active areas are so close together that photoresist can not be reliably patterned between them. If an implant falls on such adjacent active areas, the field oxide must reliably stop the implant so it will not short circuit or lower their breakdown voltage. When a LOCOS isolation scheme is used in a semiconductor process, the isolation oxide must be made thick enough to stop all expected implants.

As semiconductor device dimensions shrink in size and pitch, it becomes increasingly difficult to grow a thick and robust LOCOS oxide between closely spaced silicon regions. This is because the oxide thins as it approached the active silicon edge, forming the classic "bird's head" profile. Therefore, the full desired thickness may never be achieved if the active areas are so close that the opposing bird's heads intersect. Compounding this problem, after growth the field oxide is exposed to several subsequent processing steps that diminish its thickness, and further reduces its effectiveness as an ion implant blocking agent. These include the oxide etches associated with the oxide spacer formation and other processing steps. Their effect is shrinkage of all isolation oxide regions both laterally and vertically. The oxide between closely spaced active regions is affected proportionally more since it is thinner at the start.

Figure 1:
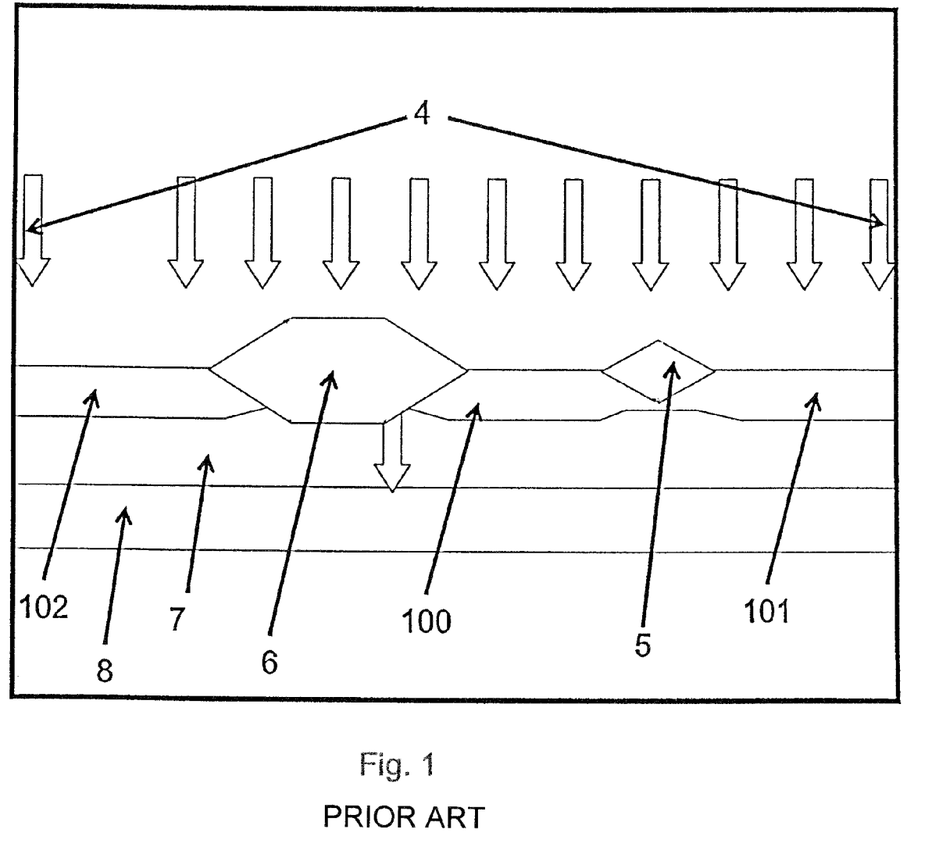
FIG. 1 is a cross sectional view of LOCOS field oxide formed between closely and wider spaced active areas.

This implant stopping problem with LOCOS is illustrated in FIG. 1. A substrate of monocrystalline silicon 8 has an epitaxial layer 7 that holds active silicon areas 100, 101, and 102. The active silicon regions 100, 101, and 102 are isolated by oxide regions 5 and 6. The gap between areas 100 and 101 is smaller than the gap between areas 100 and 102, and as a result the opposing bird's heads merge for isolation region 5. This makes the isolation oxide 5 thinner and narrower than the other isolation oxide 6. The active silicon areas 100, 101, and 102 are simultaneously doped by a locally unmasked ion implant 4. The implanted dopant ions 4 are supposed to be blocked outside of the active areas 100, 101, and 102 by the isolation oxides 5 and 6. During ion implantation the relatively thick field oxide 6 successfully masks dopant ions 4 from penetrating into the epitaxial layer 7. However, the thinner field oxide 5 fails to block the implant ions 4 from penetrating into layer 7. As a result, regions 100 and 101 are not well electrically isolated due to the implanted dopant resident beneath oxide 5.

There are other, more robust methods to integrate isolation oxide between active silicon regions, such as shallow or deep trench isolation where the trenches are etched and filled with oxide or other insulating material. But those trench techniques add further process steps and thus increase the cost of manufacture of integrated circuits. For this reason, the continued used of simple LOCOS isolation is desirable when possible.

Others have attempted one or more modifications to the conventional LOCOS process to preserve the thickness of the LOCOS oxide, especially in areas between closely spaced active areas. Examples of such techniques are found in one or more patents including and not limited to U.S. Pat. No. 5,686,346 (Duane), and U.S. Pat. No. 5,821,153 (Tsai et al.), U.S. Pat. No. 5,895,257 (Tsai et al.) and U.S. Pat. No. 6,054,368 (Yoo et al.). Those methods all require extra process steps which add protective edges to the LOCOS regions, rebuild the eroded field oxide, or make the field oxide less susceptible to subsequent erosion.

SUMMARY

The invention described below effectively preserves and enhances narrow LOCOS regions without a disruptive change to the core process flow. One modification is that the gate poly is masked to remain on some of the critical narrow isolation oxide areas. After a layer of gate polysilicon is deposited, a layer of photoresist is exposed through a mask that has a pattern of the gates and a pattern of the critical LOCOS areas. The resist is developed and the polysilicon etched to define the gate structures and LOCOS protection structures. In addition to the standard circuit poly structures such as gates and resistors, polysilicon tiles are formed over critical LOCOS areas. The polysilicon tiles prevent the LOCOS from removal during wet and dry etching operations. They also increase the thickness and hence the implant stopping ability of the oxide by the additional thickness of the polysilicon. The polysilicon tiles may be silicided and left electrically unconnected, and remain on the wafer through processing and on the finished product.

DETAILED DESCRIPTION

Figure 2:
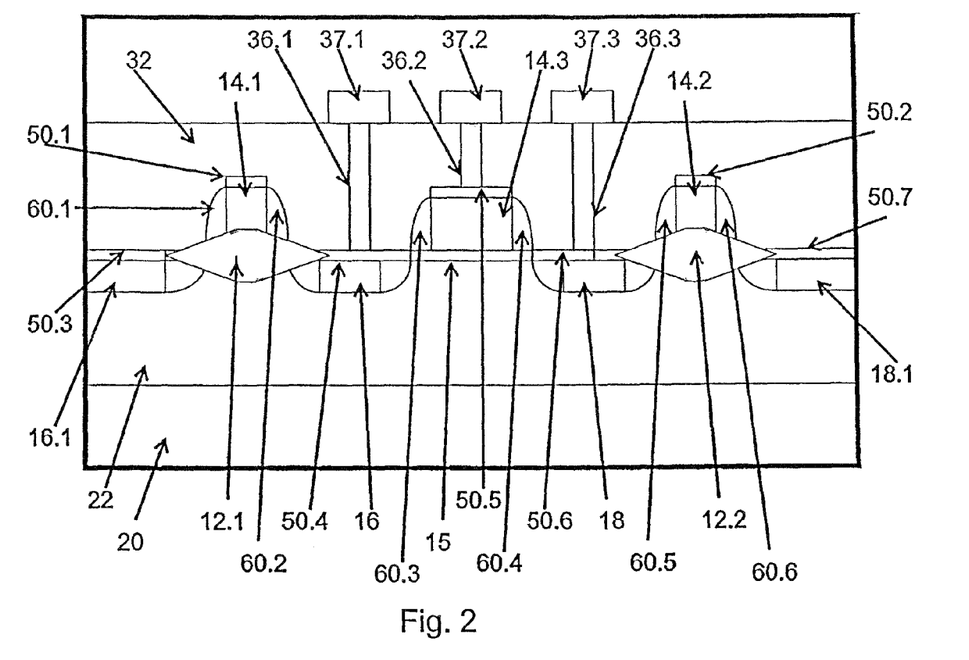
FIG. 2 is cross sectional view of a portion of an integrated circuit showing an NMOS or PMOS transistor with polysilicon tiles.

FIG. 2 shows a transistor, either nmos or pmos, made with floating polysilicon tiles 14.1, 14.2. The substrate 20 has an epitaxial layer 22. That layer holds the source and drain 16, 18, which are active regions doped with implanted species of the same type. Between the source and drain and on top of the epitaxial layer is an insulated gate having a gate oxide 15 and conductive polysilicon gate 14.3. The epitaxial layer 22 also supports LOCOS isolation regions 12.1 and 12.2. They separate adjacent implanted active regions 16.1 from the drain 16 and 18.1 from the source 18, respectively. On the upper surface of the LOCOS regions 12.1, 12.2 are polysilicon tiles 14.1, 14.2, respectively. On the sides of the polysilicon gate 14.3 and the polysilicon tiles 14.1 and 14.2 are oxide spacers 60.1-60.6. There are silicide layers 50.1-50.7 on top of the polysilicon tiles 14.1-14.2, the polysilicon gate 14.3, the source 18, the drain 16, and the adjacent silicon regions 16.1 and 18.1. An insulation layer 32 covers the substrate and other structures. Metal interconnect structures 37.1-37.3 are patterned on top of this insulator 32. Metal filled contact plugs 36.1-36.3 connect the metal layers to the silicide layers on top of the source, gate, and drain, respectively.

The polysilicon tiles 14.1, 14.2 are formed during the same deposition and etch steps as the gate polysilicon 14.3. The tile silicide regions 50.1 and 50.2 are also formed during the same process step as the formation of the other silicide regions. The spacers adjacent to the poly tiles 60.1, 60.2, 60.5, and 60.6 are formed at the same time as the spacers along the gate oxide 60.3 and 60.4. The polysilicon tiles are not electrically connected to any voltage or current sources. As such, the structure of the invention does not require any new process steps or impact the electrical design of the circuit in any way. Since the polysilicon tiles are formed before the spacers and the silicide, they protect the isolation oxide during these erosive steps. Therefore, the tiles prevent most of the width and thickness reduction of the LOCOS that would otherwise occur. As a result, the LOCOS regions between closely spaced active regions, which are relatively thin to begin with, are not further compromised. To the contrary, the thickness of the poly tile effectively enhances their thickness relative to implant masking ability. Therefore, the implant into the source 18 does not cause electrical connection to the adjacent region 18.1 under the LOCOS oxide, and likewise the drain 16 does not become connected to region 16.1. The effectiveness of this has been confirmed with electrical test structures that show much higher adjacent area breakdown voltages when the poly tiles structures are used. This is true for both NMOS and PMOS doping arrangements. Also, providing further confirmation of this method, significant product yield enhancement was observed when floating tiles were added to a production circuit relative to identical circuits without the tile The process for manufacturing the polysilicon tiles is illustrated in a series of steps shown in FIGS. 3-7. The process begins with a silicon monocrystalline substrate 20. The substrate is placed in a conventional reactor to grow an epitaxial layer 22 of matching monocrystalline silicon. Then the epitaxial layer is prepared for a local oxidation (LOCOS) operation. One of the key advantages of using silicon as a semiconductor material is its key property of fabricating an isolating layer in situ by oxidizing the silicon material.

Figure 3:
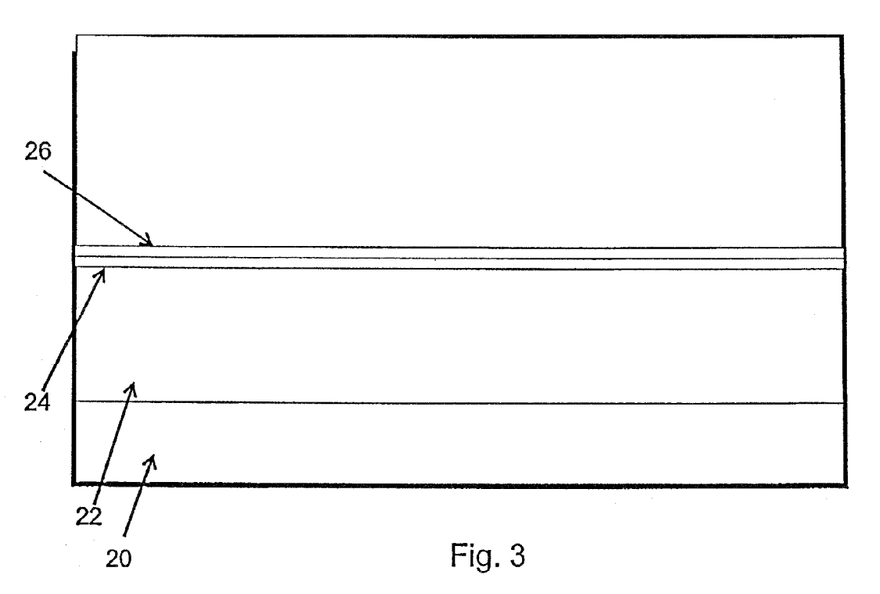
FIGS. 3-7 are sequential steps in the formation of the transistor shown in FIG. 2.
Figure 4:
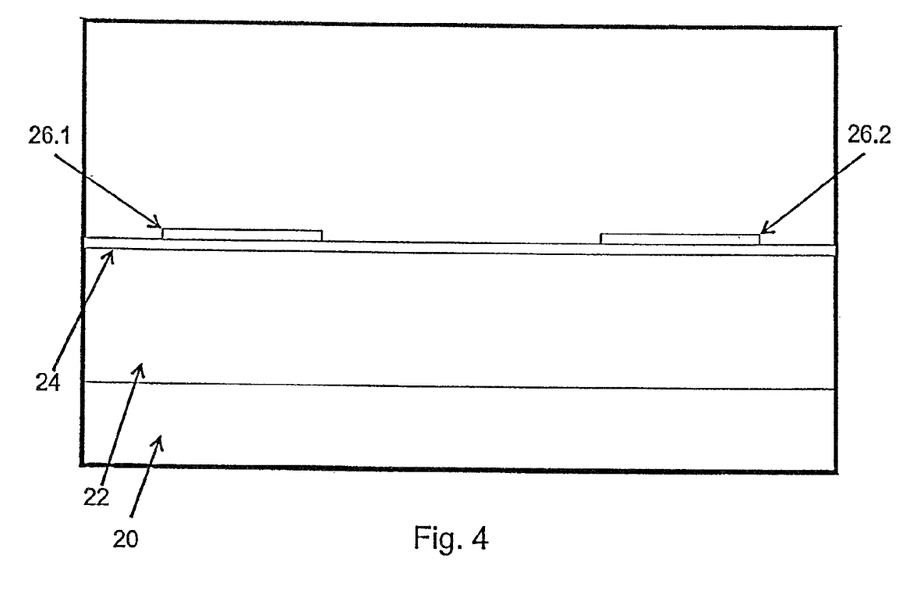
Figure 5:
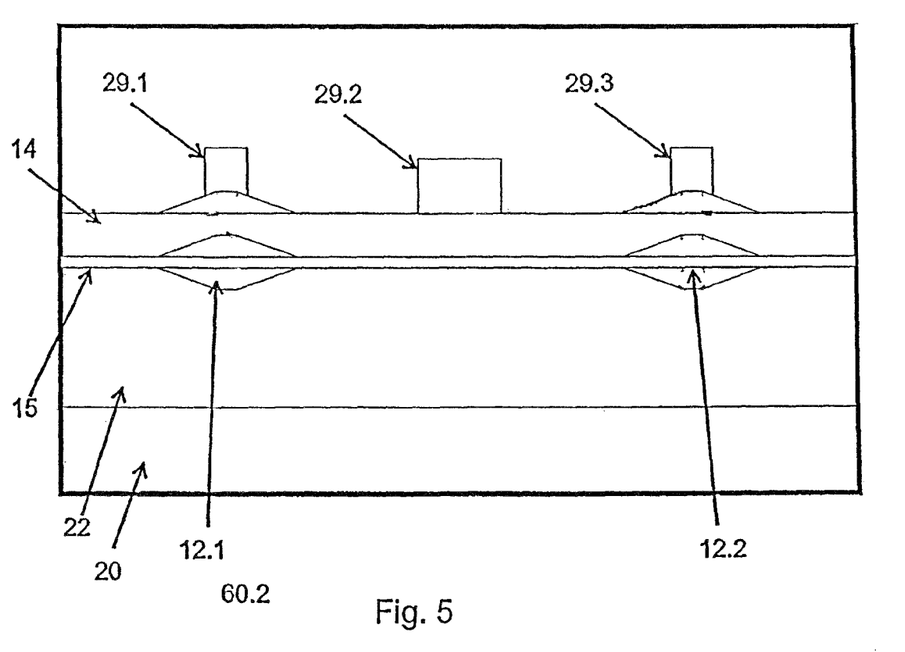
Figure 6:
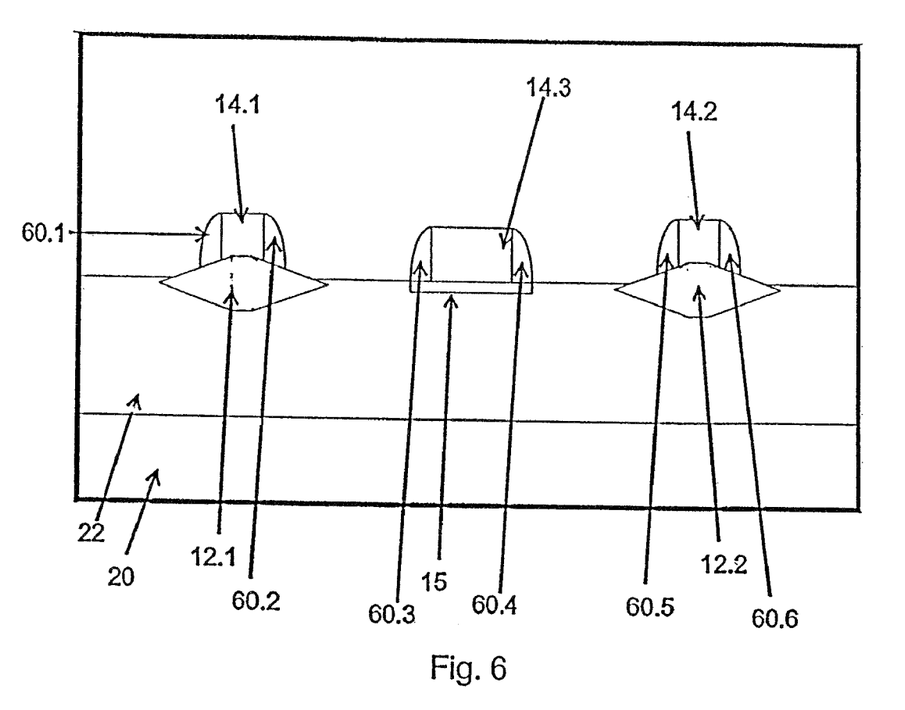

In a typical LOCOS processing sequence a thin layer 24 called a pad oxide is deposited or grown on the epitaxial layer 22. The pad oxide is covered with a layer of silicon nitride 26. Next a layer of photoresist is deposited on the nitride layer and patterned to have openings above future LOCOS regions 12.1, 12.2. Suitable wet or dry etching operations are preformed to selectively remove the nitride above the surface of the epitaxial layer 22 that will be locally oxidized. Next the wafer is subjected to a thermal oxidation step that typically comprises heating the wafer in the presence of steam or another source of oxygen. The portions of the epitaxial layer 22 without nitride 26.1 and 26.2 above them are oxidized to form the LOCOS field oxide regions 12.1, 12.2.

In following steps (not shown) the remaining nitride layer is removed. The pad oxide is also removed above the active silicon regions, a step which also slightly thins the isolation oxide. Then the surface of the epitaxial layer 22 is oxidized again to form a gate oxide layer 15 on the exposed silicon surface. The wafer is later covered with a layer of polysilicon 14 by a conventional process, such as the decomposition of silane gas. See FIG. 5. Another photolithography sequence is preformed is formed over the polysilicon layer 14, leaving patterned photoresist regions 29.1-29.3. Then the underlying and exposed polysilicon and gate oxide layers 14, 15 are suitably removed by wet or dry etching using conventional technology. This etch step is normally performed in all CMOS, NMOS and PMOS processes. It generally forms the gate structure that is an essential component for the transistors. However, in the process of the invention, the gate formation step is also used to form polysilicon tiles 14.1, 14.2 over the LOCOS regions 12.1, 12.2. Since the mask for making the gates is a necessary step, the further requirement of making a mask with added patterns for the polysilicon tiles imposes no added cost on the process. It is therefore "free" to add the polysilicon tiles to the conventional process flow.

The photoresist is stripped, leaving the polysilicon tiles 14.1, 14.2 and the polysilicon gate 14.3. See FIG. 6. The following steps form self-aligned source and drain connections in the silicon active areas. The wafer is placed in an ion implantation tool. Ions of n-type or p-type are implanted into the substrate to form active areas. If the integrated circuit is a CMOS device, the nmos transistors will be masked during p-type ion implants and then the p-type transistors will be masked during n-type implant. However, it is no longer necessary or required to mask the field oxide regions 12.1, 12.2 between devices of the same type (either both nmos or both pmos). If two nmos or two pmos devices are closely spaced and photoresist is not patterned between them then the implant must be stopped by the isolation oxide. The addition of the poly tiles augments this masking function during the source and drain implant step. The end result is that during ion implant the LOCOS regions 12.1, 12.2 and their respective tiles 14.1, 14.2 are thick enough to prevent the implanted ions from reaching regions of the epitaxial layer 22 that are beneath the LOCOS regions 12.1, 12.2. As a result, the source and drain implant 16, 18 for the active areas are self-aligned not only with the gate 14, 15 but also with the LOCOS regions 12.1, 12.2.

Figure 7:
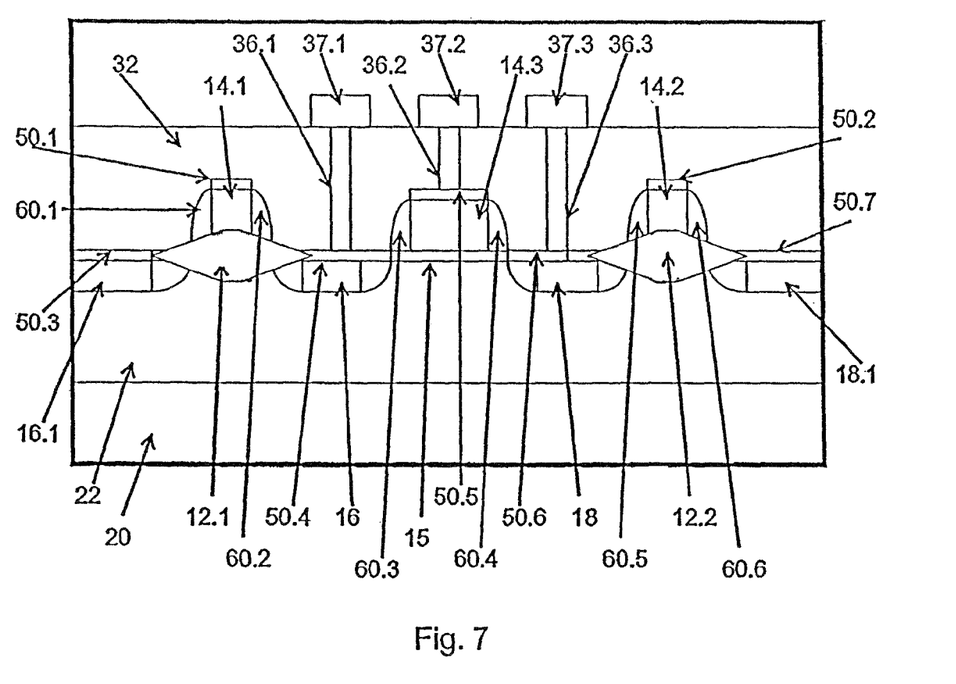

During further processing, all polysilicon structures will have oxide spacers 60.1-60.7 added. In a silicide step, exposed epitaxial silicon in the source 16 and drain 18 and exposed polysilicon in the gate 14.3 and tiles 14.1, 14.2 will be converted to silicide layers 50.1-50.7. Such layers reduce the transistor source, drain and gate resistance. Siliciding the tiles has no adverse impact because the tiles 14.1, 14.2 will be allowed to electrically float and will be electrically isolated from conductive regions. In other words, they will not be connected to any voltage or current source. An insulation layer 32 covers the substrate and metal contacts extend from the surface of the insulating layer 32 to the silicide surfaces 50.3, 50.4, 50.5 of the gate, source, and drain.

Figure 12:
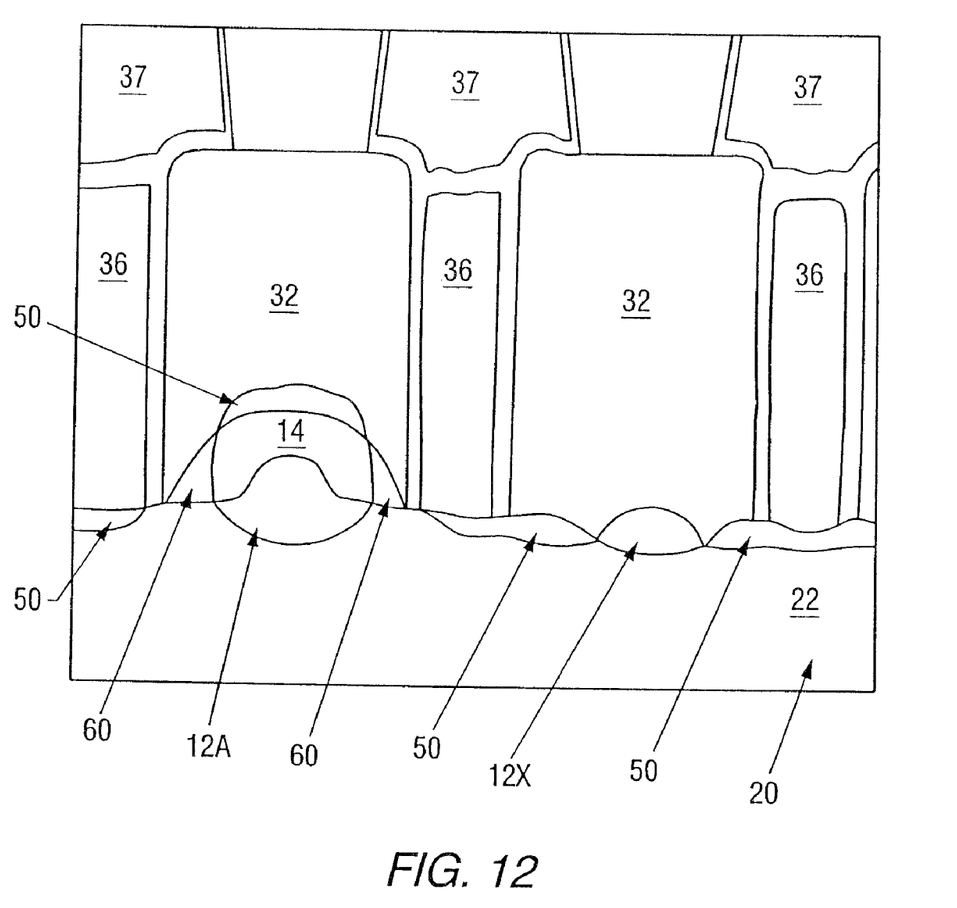
FIG. 12 is a depiction of a photomicrograph taken with a scanning electron microscope of a portion of test structures made with and without the invention.

FIG. 12 is a depiction of a photomicrograph of a test structure that compares LOCOS regions 12A made with the invention to LOCOS region 12X made without the invention. Epitaxial layer 22 is covered with an insulating layer 32. Vias in the layer 32 are filled with metal 36 to contact surface regions on the epitaxial layer 22. Silicide regions 50 are formed on polysilicon or epitaxial silicon. In the left side of the photomicrograph, the LOCOS region 12A is covered and protected by a polysilicon tile 14. The tile 14 has a top silicide layer 50 and sidewall oxide spacers 60. Compared to the conventional, unprotected LOCOS structure 12X, the LOCOS structure 12A made with the invention is thicker and wider. Notice how the unprotected LOCOS structure is thinner than LOCOS structure 12A and how it is shorter than 12A because the edges of the LOCOS regions 12X have been reduced by one or more etching steps.

Figure 8:
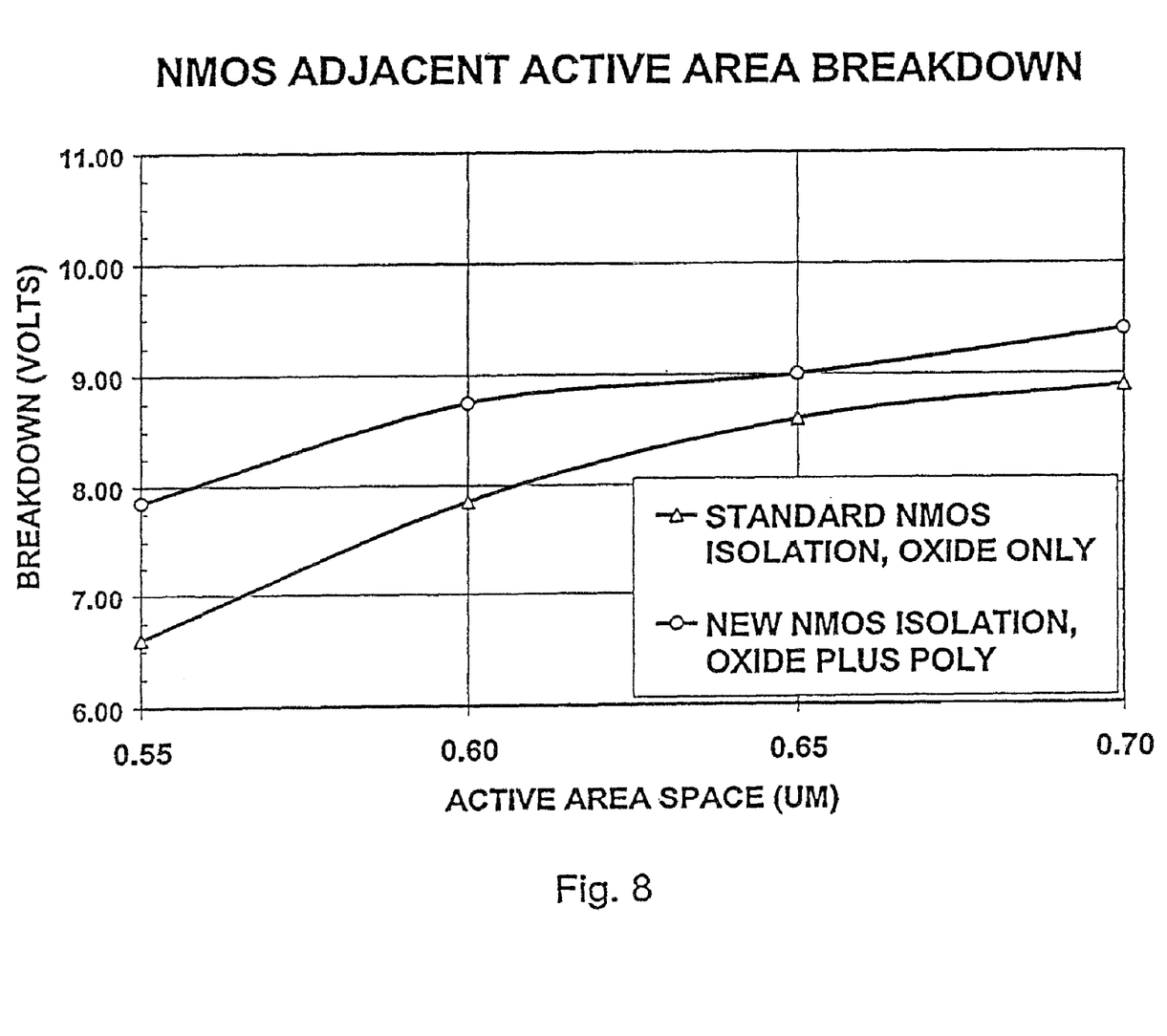
FIG. 8 is a graph showing breakdown voltages of NMOS transistors with and without polysilicon tiles.
Figure 9:
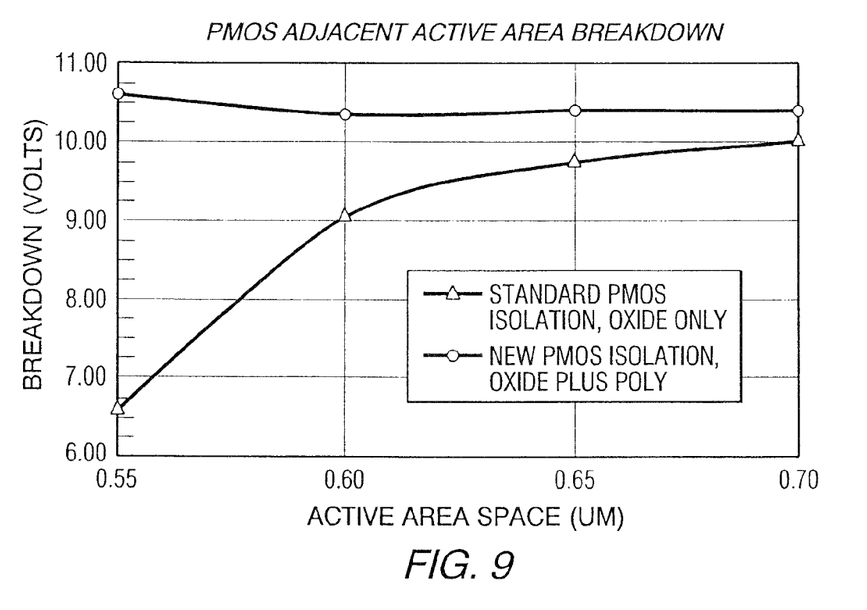
FIG. 9 is a graph showing breakdown voltages of PMOS transistors with and without polysilicon tiles.
Figure 10A:
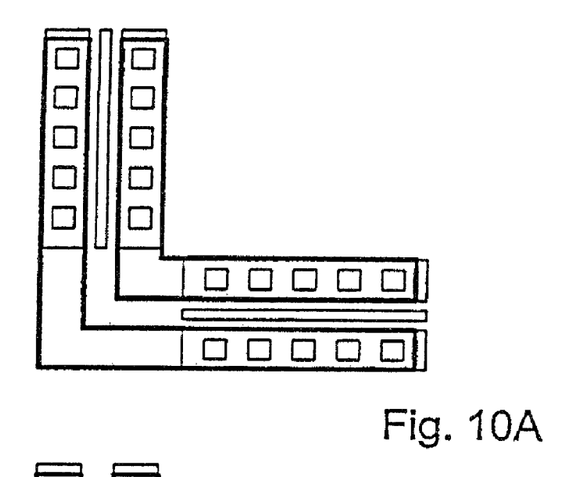
FIGS. 10A and 10B show test structures with and without polysilicon tiles.
Figure 10B:
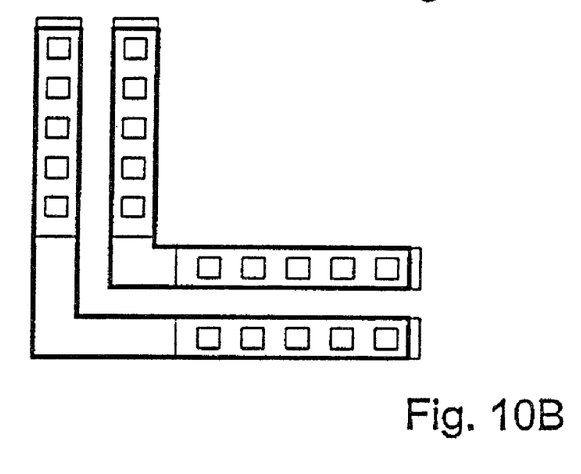

In order to test the invention, a series of test devices with and without the floating polysilicon tiles were fabricated. The test structures included nmos and pmos active areas both with and without floating polysilicon tiles. The areas were spaced apart in 0.05 micron intervals between 0.55 and 1.00 microns in width. In each case the breakdown voltage of the test structure was measured. Typical test structures without polysilicon tiles and with polysilicon tiles are shown in FIGS. 10a, 10b, respectively. The test results are shown in graphical form in FIGS. 8 and 9. In FIG. 8, the improvement in breakdown was greatest for nmos devices with 0.55 micron spacing. The invention improved breakdown performance from about 6.5 volts without the floating tiles to almost 8 volts with the floating tiles. The improvement in pmos devices was more dramatic. Their breakdown voltage improved from 6.5 volts without the tiles to more than 10.5 with the tiles. The test structures were source/drain breakdown test structures that were fabricated to evaluate the floating poly solution. The experiments also showed that floating poly tiles had little beneficial affect on devices where the spacing between adjacent active areas and the LOCOS was one micron of more wide. However, for devices with LOCOS regions less than 0.6 microns, improvement was significant. This is as expected since the before mentioned oxide thinning was only seen for closely spaced active regions.

Further confirmation of the invention's effectiveness was seen during a product test. Two batches of product were made, one using the polysilicon tiles between closely spaced active regions, and another not using them. In all other ways, the products were identical. They were fabricated at the same time, using the same flow. Two experimental variables were introduced to each of the products. The first one slightly reduced the minimum active area space, and the second slightly increased the cmos source and drain implant energies. These variables were intended to exacerbate the adjacent active area isolation problems discussed earlier. The following table shows product test results and demonstrates that the invention improves yields between two to four times the yields of devices made without the invention where the minimum spacing between active areas is less than 0.65 microns. See trials 5-8.

TABLE

| Trial | Minimum Spacing (microns) | Floating Poly Tiles? | P+ Source/Drain Energy | Wafer Sort Yield (%) |
|---|---|---|---|---|
| 1 | 0.65 | NO | 50 KeV | 97 |
| 2 | 0.65 | NO | 65 KeV | 98 |
| 3 | 0.65 | YES | 50 KeV | 97 |
| 4 | 0.65 | YES | 65 KeV | 97 |
| 5 | 0.55 | NO | 50 KeV | 58 |
| 6 | 0.55 | NO | 65 KeV | 16 |
| 7 | 0.55 | YES | 50 KeV | 98 |
| 8 | 0.55 | YES | 60 KeV | 96 |

Figure 11:
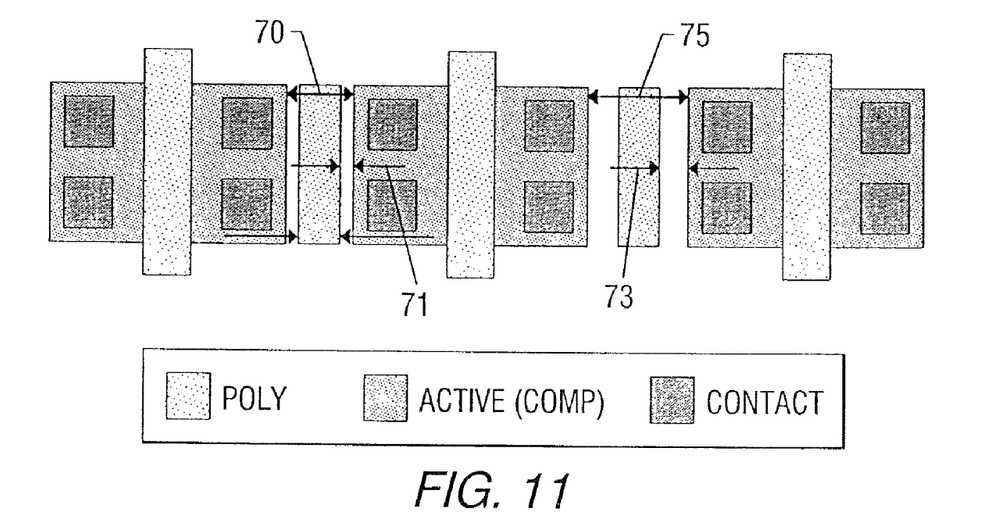
FIG. 11 is a plan view of a layout algorithm for applying polysilicon tiles to different size active areas.

In one embodiment of the process, the floating polysilicon tiles are generated with an algorithm in the following manner. Layout dimensions for the algorithm are shown in FIG. 11. For active areas spaces 70 less than or equal to 0.6 microns, floating polysilicon tiles are generated at a distance 71 that is 0.15 microns from the edges of the active areas. For active area spaces 75 greater than 0.6 microns, but less than or equal to 1.0 microns, floating polysilicon tiles were generated at a distance 73 that is 0.20 microns from the active edges. For active area spaces greater than 1.0 microns, no floating polysilicon tiles are generated.

While the above description has been made for only one transistor, those skilled in the art understand that the transistor described above and the above process may be used to manufacture nmos, pmos or cmos integrated circuits. The invention may also be incorporated into bicmos products and processes since it has no adverse impact on bipolar transistors and may also assist in separating bipolar devices from each other.

The invention claimed is:

1. A process for fabricating a metal oxide integrated circuit comprising the steps of:
   providing a substrate of monocrystalline silicon;
   depositing a layer of silicon nitride over the substrate;
   forming openings in the silicon nitride layer to expose surface regions for local oxidation;
   locally oxidizing the exposed surface regions of the silicon substrate to form regions of local oxide (LOCOS);
   removing the rest of the silicon nitride layer to expose surface regions of the silicon substrate between the LOCOS regions;
   oxidizing the exposed surface regions of the silicon substrate to form a gate oxide layer on the silicon substrate;
   depositing a polysilicon layer over the surface of the substrate;
   patterning the polysilicon layer to simultaneously form polysilicon gates and LOCOS protection tiles;
   implanting the substrate to form active regions in the semiconductor substrate; and
   forming metal interconnects and contact plugs to connect together at least some of the active regions;
   wherein the LOCOS protection tiles electrically float.

2. The process of claim 1 comprising the further step of removing the gate oxide layer from active regions.

3. The process of claim 1 wherein the step of implanting the active areas occurs after formation of the LOCOS protection tiles.

4. The process of claim 1 wherein the active regions comprise source regions on one side of the gates and drain regions on the other side of the gates.

5. The process of claim 1 wherein the active regions comprise source regions on both sides of the gates.

6. The process of claim 5 further comprising forming a drain region on the opposite side of the semiconductor substrate.

7. The process of claim 1 further comprising the steps of depositing other insulating layers over the substrate and patterning and removing unwanted portions of those layers and leaving the LOCOS protection tiles in place to prevent reduction of the size of the LOCOS regions during such further steps.

8. The process of claim 1 wherein the maximum thickness of the LOCOS regions remains substantially the same during subsequent process steps.

9. The process of claim 1 wherein breakdown voltage of a device with LOCOS protection tiles is greater than a corresponding device made with the same process steps but without LOCOS protection tiles.

10. The process of claim 1 wherein for active area spaces less than of equal to 0.6 microns, the LOCOS protection tile is generated 0.15 microns from the edges of the active areas.

11. The process of claim 1 wherein for active area spaces greater than 0.6 microns and less than 1.0 microns, the LOCOS protection tile is generated 0.20 microns from the edges of the active areas.

12. A process for fabricating a metal oxide integrated circuit comprising the steps of:
   providing a substrate of monocrystalline silicon;
   depositing a layer of silicon nitride over the substrate;
   forming openings in the silicon nitride layer to expose surface regions for local oxidation;
   locally oxidizing the exposed surface regions of the silicon substrate to form a plurality of regions of local oxide (LOCOS);
   removing the rest of the silicon nitride layer to expose surface regions of the silicon substrate between the LOCOS regions;
   oxidizing the exposed surface regions of the silicon substrate to form a gate oxide layer on the silicon substrate;
   depositing a polysilicon layer over the surface of the substrate;
   patterning the polysilicon layer to simultaneously form polysilicon gates and LOCOS protection tiles; and
   implanting the substrate to form active regions in the semiconductor substrate;
   wherein each of the plurality of LOCOS regions lie between two of the active regions which have a minimum spacing of less than about 0.65 microns.

13. The process of claim 12 further comprising the steps of depositing other insulating or conductive layers over the substrate and patterning and removing unwanted portions of those layers and leaving the LOCOS protection tiles in place to prevent reduction of the size of the LOCOS regions during such further steps.

14. The process of claim 12 wherein the maximum thickness of the LOCOS regions remains substantially the same during subsequent process steps.

15. The process of claim 12 wherein breakdown voltage of a device with LOCOS protection tiles is greater than a corresponding device made with the same process steps but without LOCOS protection tiles.

16. The process of claim 12 wherein for active area spaces less than of equal to 0.6 microns, the LOCOS protection tile is generated 0.15 microns from the edges of the active areas.

17. The process of claim 12 wherein for active area spaces greater than 0.6 microns and less than 1.0 microns, the LOCOS protection tile is generated 0.20 microns from the edges of the active areas.

\* \* \* \* \*